United States Patent
Seo

(10) Patent No.: US 10,324,639 B2
(45) Date of Patent: Jun. 18, 2019

(54) DATA STORAGE DEVICE HAVING MULTIPLE SOLID STATE DRIVES FOR DATA DUPLICATION, AND DATA PROCESSING SYSTEM INCLUDING THE SAME

(71) Applicant: SAMSUNG ELECTRONICS CO., LTD., Suwon-si, Gyeonggi-Do (KR)

(72) Inventor: Jung Min Seo, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/425,587

(22) Filed: Feb. 6, 2017

(65) Prior Publication Data
US 2017/0262202 A1    Sep. 14, 2017

(30) Foreign Application Priority Data

Mar. 14, 2016  (KR) .................. 10-2016-0030241

(51) Int. Cl.
G06F 3/06  (2006.01)
G11C 16/10  (2006.01)
G11C 16/26  (2006.01)

(52) U.S. Cl.
CPC ............ *G06F 3/0619* (2013.01); *G06F 3/065* (2013.01); *G06F 3/0665* (2013.01); *G06F 3/0688* (2013.01); *G11C 16/10* (2013.01); *G11C 16/26* (2013.01)

(58) Field of Classification Search
CPC ....... G11C 16/26; G11C 16/10; G06F 3/0688; G06F 3/0665; G06F 3/065; G06F 3/0619
See application file for complete search history.

(56) References Cited

U.S. PATENT DOCUMENTS

| | | | | |
|---|---|---|---|---|
| 5,603,001 A | * | 2/1997 | Sukegawa | G06F 3/0601 711/103 |
| 5,659,704 A | * | 8/1997 | Burkes | G06F 11/1076 711/114 |
| 6,725,392 B1 | * | 4/2004 | Frey | G06F 11/1076 714/15 |
| 8,069,301 B2 | | 11/2011 | Fukutomi et al. | |

(Continued)

OTHER PUBLICATIONS

Patterson, David A. et al, "A Case for Redundant Arrays of Inexpensive Disks (RAID)," Computer Science Division, Department of Electrical Engineering and Computer Sciences, pp. 109-116, 1987.

*Primary Examiner* — Larry T Mackall
(74) *Attorney, Agent, or Firm* — Volentine, Whitt & Francos, PLLC

(57) ABSTRACT

A data storage device includes a plurality of solid state disks (SSDs) and a controller configured to control the SSDs. The controller respectively writes a first data segment and duplicated data of the first data segment to first-type memories of two respective SSDs among the plurality of SSDs in response to a first write request of a host, respectively writes a second data segment and duplicated data of the second data segment to first-type memories of two respective SSDs among the plurality of SSDs in response to a second write request of the host, and writes parity data generated based on the duplicated data to a first-type memory or a second-type memory of a parity SSD. The data storage device may be included in a data processing system.

15 Claims, 15 Drawing Sheets

(56) References Cited

U.S. PATENT DOCUMENTS

| | | |
|---|---|---|
| 8,266,475 B2 | 9/2012 | Maeda et al. |
| 8,448,034 B2 | 5/2013 | Asano et al. |
| 8,555,027 B2 | 10/2013 | Kimura et al. |
| 8,583,866 B2 | 11/2013 | Chambliss et al. |
| 8,615,681 B2 | 12/2013 | Horn |
| 8,707,090 B2 | 4/2014 | Akutsu |
| 8,862,804 B2 | 10/2014 | Horn |
| 9,003,140 B2 | 4/2015 | Ikeuchi et al. |
| 9,817,717 B2 * | 11/2017 | Lee .................... G06F 11/1044 |
| 2001/0029570 A1 * | 10/2001 | Yamamoto .......... G06F 11/2064 |
| | | 711/113 |
| 2004/0117414 A1 * | 6/2004 | Braun ...................... G06F 8/65 |
| 2012/0192035 A1 * | 7/2012 | Nakanishi ........... G06F 11/1048 |
| | | 714/766 |
| 2015/0301749 A1 | 10/2015 | Seo et al. |

\* cited by examiner

FIG. 9A

WriteNV(LBA, DATA, Flush_Manually)
DeleteNV(LBA)

FIG. 9B

Calculate_Parity_And_Write1(DataSize, StartLBA, EndLBA, DestinationLBA)
Calculate_Parity_And_Write2(DataSize, FirstLBA, SecondLBA, ..., LastLBA, DestinationLBA)
Calculate_Parity_And_Write3(DataSize, StartLBA, Offset, DestinationLBA)

FIG. 9C

Write_and_Calc_Parity1(Data, DataSize, StartLBA, EndLBA, DestinationLBA)
Write_and_Calc_Parity2(Data, DataSize, FirstLBA, ..., LastLBA, DestinationLBA)
Write_and_Calc_Parity3(Data, DataSize, StartLBA, Offset, DestinationLBA)

FIG. 9D

Calculate_Parity_And_Write_NV(PrevLBA, Data, DataSize, DataLBA)

DATA STORAGE DEVICE HAVING MULTIPLE SOLID STATE DRIVES FOR DATA DUPLICATION, AND DATA PROCESSING SYSTEM INCLUDING THE SAME

CROSS-REFERENCE TO RELATED APPLICATIONS

This application claims priority under 35 U.S.C. § 119(a) from Korean Patent Application No. 10-2016-0030241 filed on Mar. 14, 2016, the disclosure of which is hereby incorporated by reference in its entirety.

BACKGROUND

Embodiments of the inventive concept relate to a data storage device, and more particularly, to a data storage device including non-volatile random access memory and a data processing system including the data storage device.

Mass storage devices usually include a plurality of memory devices. Memory devices are used to store data, and may be divided into volatile memory devices and non-volatile memory devices. A flash memory device is an example of electrically erasable programmable read-only memory (EEPROM) in which a plurality of memory cells are erased or programmed in a single program operation. A program or read operation is performed on each page and an erase operation is performed on each block. A block may include a plurality of pages. One type of flash memory device is a NAND flash memory device.

Meanwhile, data duplicating is frequently used for data restoration in case of a fault in a storage device or a power fault.

SUMMARY

According to some embodiments of the inventive concept, there is provided a data storage device including a plurality of solid state disks (SSDs) and a controller configured to control the SSDs. The controller may be configured to write a first data segment and duplicated data of the first data segment to first-type memories of two respective SSDs among the plurality of SSDs in response to a first write request of a host, may be configured to write a second data segment and duplicated data of the second data segment to first-type memories of two respective SSDs among the plurality of SSDs in response to a second write request of the host, and may be configured to write parity data generated based on the duplicated data of the first data segment and the duplicated data of the second data segment to either of a first-type memory and a second-type memory of a parity SSD among the plurality of SSDs.

According to other embodiments of the inventive concept, there is provided a data processing system including a host and a data storage device connected to the host, the data storage device including first through N-th SSDs, where N is an integer of at least 2, and a controller configured to control the first through N-th SSDs.

The controller may be configured to store each of data segments corresponding to a plurality of write requests received from the host in first-type memory of corresponding one of the first through (N−1)-th SSDs, may be configured to store duplicated data based on some of the data segments in first-type memory of the N-th SSD, and may be configured to store parity data based on all of the data segments in the first-type memory or second-type memory of the N-th SSD.

According to further embodiments of the inventive concept, there is provided a method of operating a data storage device which includes a controller, a buffer, and a plurality of SSDs. The method includes receiving a first write request from a host, writing a first data segment to the buffer in response to the first write request, writing the first data segment to a first SSD among the plurality of SSDs, writing the first data segment to an N-th SSD among the plurality of SSDs, sending a response to the first write request to the host, receiving a second write request from the host, writing a second data segment to the buffer in response to the second write request, writing the second data segment to a second SSD, writing duplicated data based on the second data segment to the N-th SSD, and sending a response to the second write request to the host.

According to still further embodiments of the inventive concept, a data storage device is provided, comprising: a plurality of solid state drives (SSDs), including at least a first SSD, a second SSD and a parity SSD, wherein each of the SSDs includes at least one first-type memory and at least one second-type memory; and a controller configured to control operations of the plurality of SSDs, wherein the controller is configured to write a first data segment to the first-type memory of the first SSD in response to a first write command received from a host, and to write a second data segment to the first-type memory of the second SSD in response to a second write command received from the host, and further in response to the at least one of the first and second write commands received from the host to write data based on the first data segment and the second data segment to the first-type memory of the parity SSD, and subsequently to write parity data generated from at least the first data segment and the second data segment to at least one of the first-type memory and the second-type memory of the parity SSD.

BRIEF DESCRIPTION OF THE DRAWINGS

The above and other features and advantages of the inventive concept will become more apparent by describing in detail exemplary embodiments thereof with reference to the attached drawings.

FIGS. 9A, 9B, 9C and 9D show commands which a controller issues to an SSD according to some embodiments of the inventive concept.

DETAILED DESCRIPTION OF THE EMBODIMENTS

Some embodiments of the inventive concept provide a data storage device which may include a plurality of solid state drives or solid state disks (SSDs), each of which includes first-type memory (e.g., non-volatile random-access memory (NVRAM)) for primary duplication (e.g., RAID 1 duplication) and second-type memory (e.g., NAND (e.g., NAND Flash memory) for secondary duplication (e.g., RAID 5/6 duplication).

Figure 1:
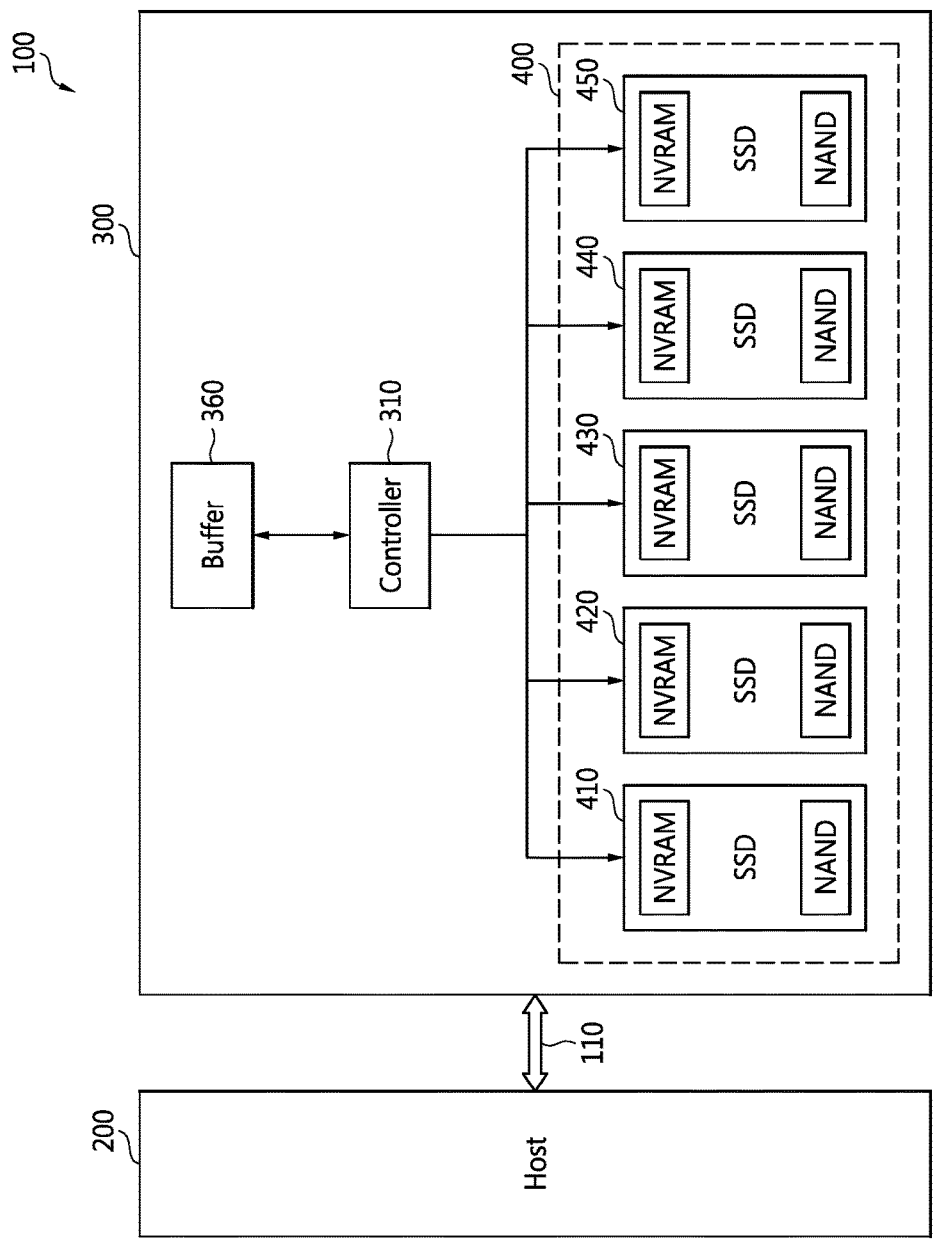
FIG. 1 is a block diagram of a data processing system according to some embodiments of the inventive concept.
Figure 2:
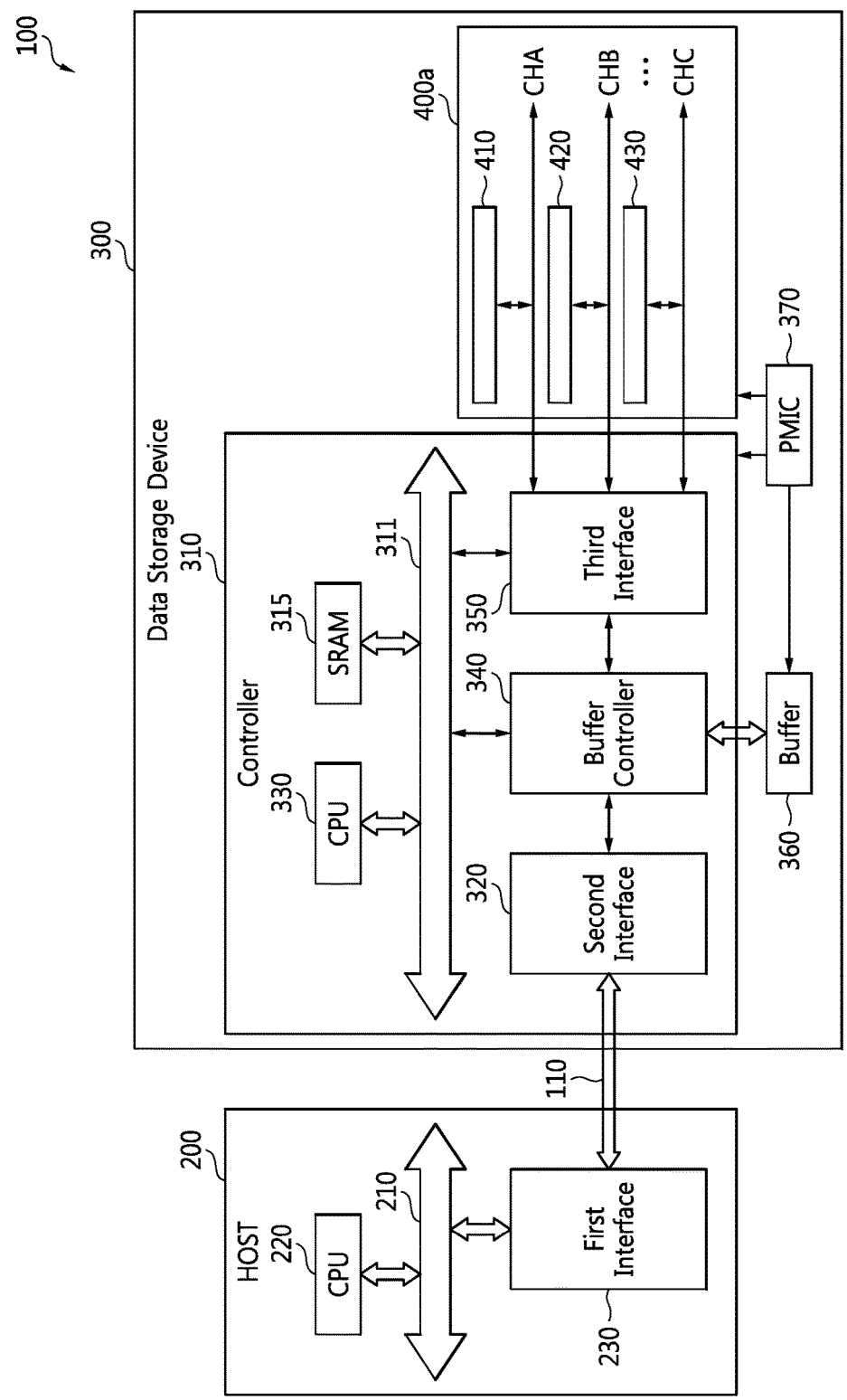
FIG. 2 is a block diagram of a host and a controller illustrated in FIG. 1 according to some embodiments of the inventive concept.

FIG. 1 is a block diagram of a data processing system 100 according to some embodiments of the inventive concept. FIG. 2 is a block diagram of a host 200 and a controller 310 illustrated in FIG. 1 according to some embodiments of the inventive concept.

Referring to FIGS. 1 and 2, data processing system 100 may include the host 200 and a data storage device 300 which communicates a command and/or data with host 200 through an interface 110. Data processing system 100 may be implemented as a personal computer (PC), a workstation, a data center, an internet data center (IDC), a storage area network (SAN), a network-attached storage (NAS), or a mobile computing device, but the inventive concept is not restricted to these examples. A mobile computing device may be implemented as a laptop computer, a cellular phone, a smart phone, a tablet PC, a personal digital assistant (PDA), an enterprise digital assistant (EDA), a digital still camera, a digital video camera, a portable multimedia player (PMP), a personal navigation device or portable navigation device (PND), a handheld game console, a mobile internet device (MID), a wearable computer, an internet of things (IoT) device, an internet of everything (IoE) device, a drone, or an e-book, but the inventive concept is not restricted to these examples.

Interface 110 may be a serial advanced technology attachment (SATA) interface, a SATA express (SATAe) interface, a SAS (serial attached small computer system interface (SCSI)), a peripheral component interconnect express (PCIe) interface, a non-volatile memory express (NVMe) interface, an advanced host controller interface (AHCI), or a multimedia card (MMC) interface but is not restricted thereto. Interface 110 may transmit electrical or optical signals.

Host 200 may control a data processing operation (e.g., a write or read operation) of data storage device 300 via interface 110. Host 200 may refer to a host controller.

Data storage device 300 may include controller 310, a buffer 360, and a plurality of memory devices 410 through 450. Data storage device 300 may also include a power management integrated circuit (PMIC) 370, as shown in FIG. 2. The plurality of memory devices 410 through 450 in FIG. 1 may be referred to collectively as a memory cluster 400, and the memory devices 410 through 430 in FIG. 2 may be referred to as a memory cluster 400a. Memory clusters 400 and 400a each may include N SSDs, where N is any integer of at least 2. Although N is five in the embodiments illustrated in FIG. 1 (comprising SSDs 410 through 450), and N is three in the embodiments illustrated in FIG. 2 (comprising SSDs 410 through 430), the inventive concept is not restricted to those embodiments and the number of SSDs may be changed.

Data storage device 300 may be a flash-based memory device but is not restricted thereto. Data storage device 300 may be implemented as an SSD, an embedded SSD (eSSD), a universal flash storage (UFS), an MMC, an embedded MMC (eMMC), or managed NAND, but the inventive concept is not restricted to these examples. The flash-based memory device may include a memory cell array. The memory cell array may include a plurality of memory cells. The memory cell array may include a two-dimensional memory cell array or a three-dimensional memory cell array.

The three-dimensional memory cell array may be monolithically formed at one or more physical levels in an array of memory cells having an active region disposed on or above a silicon substrate, and may include a circuit involved in the operation of the memory cells. The circuit may be formed in, on or above the silicon substrate. The term "monolithic" means that layers at each level in an array are directly deposited on layers at an underlying level in the array. The three-dimensional memory cell array may include a vertical NAND string which is vertically oriented so that at least one memory cell is placed on or above another memory cell. The at least one memory cell may include a charge trap layer.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Alternatively, data storage device 300 may be implemented as a hard disk drive (HDD), a phase-change random access memory (PRAM) device, a magnetoresistive RAM (MRAM) device, a spin-transfer torque MRAM (STT-MRAM) device, a ferroelectric RAM (FRAM) device, or a resistive RAM (RRAM) device, but the inventive concept is not restricted to these examples.

Controller 310 may control transfer or process of a command and/or data among host 200, buffer 360, and memory cluster 400. Controller 310 may be implemented in an integrated circuit (IC) or a system on chip (SoC).

Referring to FIG. 2, host 200 may include bus architecture 210, a central processing unit (CPU) 220, and a first interface device 230. Controller 310 may include bus architecture 311, an internal memory (e.g., static random access memory (SRAM)) 315, a second interface device 320, a CPU 330, a buffer controller 340, and a third interface device 350.

CPU 220 and first interface device 230 may communicate a command and/or data with each other via bus architecture 210. Although host 200 includes bus architecture 210, CPU 220, and first interface device 230 in the embodiments illustrated in FIG. 2, the inventive concept is not restricted to host 200 illustrated in FIG. 2. Host 200 may be implemented as an IC, a motherboard, a SoC, an application processor (AP), a mobile AP, a web server, a data server, or a database server, but the inventive concept is not restricted to these examples.

Bus architecture 210 may be implemented as advanced microcontroller bus architecture (AMBA), an advanced high-performance bus (AHB), an advanced peripheral bus (APB), an advanced extensible interface (AXI), an advanced system bus (ASB), AXI coherency extensions (ACE), or a combination thereof, but the inventive concept is not restricted to these examples.

CPU 220 may generate a write request for controlling a write operation of data storage device 300 or a read request for controlling a read operation of data storage device 300. The write request may include a write address (e.g., a logical address) and the read request may include a read address (e.g., a logical address). CPU 220 may include at least one core. The request may refer to a command.

First interface device 230 may change the format of a command and/or data to be transmitted to data storage device 300 and may transmit the command and/or data in a changed format to data storage device 300 through interface 110. First interface device 230 may also change the format of a response and/or data received from data storage device 300 and may transmit the response and/or data in a changed format to CPU 220 through bus architecture 210. First interface device 230 may include a transceiver which transmits and receives a command and/or data. The structure and operations of first interface device 230 may be configured to be compatible with interface 110.

Bus architecture 311 may be implemented as AMBA, AHB, APB, AXI, ASB, ACE, or a combination thereof, but the inventive concept is not restricted to these examples.

Internal memory 315 may store data necessary for the operations of controller 310 and/or data generated from a data processing operation (e.g. a write or read operation) performed by controller 310. Internal memory 315 may store a first flash translation layer (FTL) code that can be executed by CPU 330. The FTL code may be referred to as simply an FTL. When data storage device 300 is booted, the first FTL code may be loaded from memory cluster 400 to internal memory 315 and may be executed by CPU 330. Internal memory 315 may be implemented as RAM, dynamic RAM (DRAM), SRAM, buffer, buffer memory, cache, or tightly couple memory (TCM), but the inventive concept is not restricted to these examples.

Second interface device 320 may change the format of a response and/or data to be transmitted to host 200 and may transmit the response and/or data in a changed format to host 200 through interface 110. Second interface device 320 may also receive a command and/or data from host 200, change the format of the command and/or data, and transmit the command and/or data in a changed format to CPU 330 and/or buffer controller 340. Second interface device 320 may include a transceiver which transmits and receives a signal and/or data.

The structure and operations of second interface device 320 may be configured to be compatible with interface 110. Second interface device 320 may be a SATA interface, SATAe interface, SAS, PCIe interface, NVMe interface, AHCI, MMC interface, NAND-type flash memory interface, or NOR-type flash memory interface but is not restricted thereto.

CPU 330 may control internal memory 315, second interface device 320, buffer controller 340, and third interface device 350 through bus architecture 311. CPU 330 may include at least one core. CPU 330 may also control PMIC 370.

Buffer controller 340 may write data to and/or read data from buffer 360 according to the control of CPU 330. Buffer controller 340 may control the write and read operations for buffer 360. Buffer controller 340 also may be called a controller or a buffer manager.

Third interface device 350 may control a data processing operation (e.g. a write or read operation) for memory cluster 400a through one of main channels CHA, CHB, and CHC according to the control of CPU 330. Third interface device 350 may be a SATA interface, SATAe interface, SAS, PCIe interface, NVMe interface, AHCI, MMC interface, NAND-type flash memory interface, or NOR-type flash memory interface but is not restricted thereto.

Third interface device 350 may include an error correction code (ECC) engine (not shown). The ECC engine may correct errors in data to be stored in memory cluster 400a and/or data output from memory cluster 400a. The ECC engine may be implemented at any place in controller 310.

Buffer 360 may write data received from host 200 or read stored data according to the control of buffer controller 340. Buffer 360 may be implemented as volatile memory such as buffer memory, RAM, SRAM, or DRAM, but the inventive concept is not restricted to these examples.

Buffer 360 may include a first region which stores a mapping table for logical address-to-physical address translation with respect to a plurality of the SSDs 410 through 450; and a second region which functions as a cache, but the inventive concept is not restricted to the current embodiments.

When controller 310 and buffer 360 are formed in different semiconductor chips, respectively; controller 310 and buffer 360 may be implemented in a single package such as a package-on-package (PoP), a multi-chip package (MCP), or a system-in package (SiP), but the inventive concept is not restricted to these examples. A first chip including buffer 360 may be stacked above a second chip including controller 310 using stack balls.

PMIC 370 may control operating voltages applied to controller 310, buffer 360, and/or memory cluster 400a. A first operating voltage applied to controller 310, a second operating voltage applied to buffer 360, and a third operating voltage applied to memory cluster 400a may be the same as or different from one another.

As noted above, memory cluster 400a may include SSDs 410, 420, and 430. First SSD 410 may be connected to the first main channel CHA, second SSD 420 may be connected to the second main channel CHB, and third SSD 430 may be connected to the third main channel CHC. The structure of each of SSDs 410 through 450 will be described in detail with reference to FIG. 3 and FIGS. 4A through 4C. SSDs 410 through 450 may have the same structure as one another or similar structures to one another.

Here, a main channel may refer to an independent data path existing between third interface device 350 of controller 310 and one SSD. The data path may include transmission lines that transmit data and/or control signals.

Figure 3:
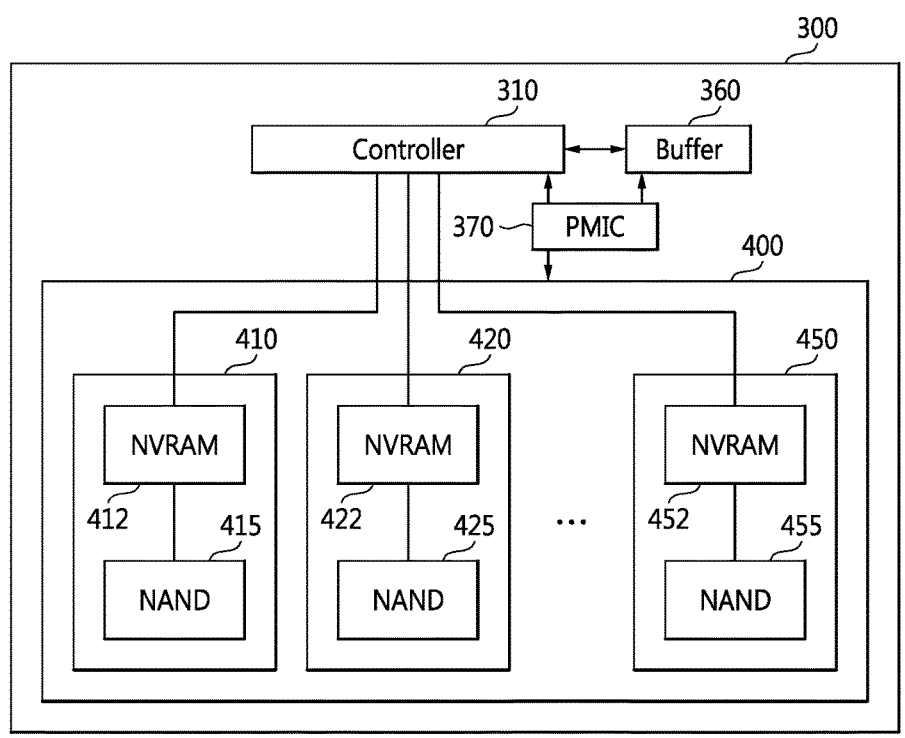
FIG. 3 is a block diagram of an embodiment of a data storage device illustrated in FIG. 1.
Figure 4A:
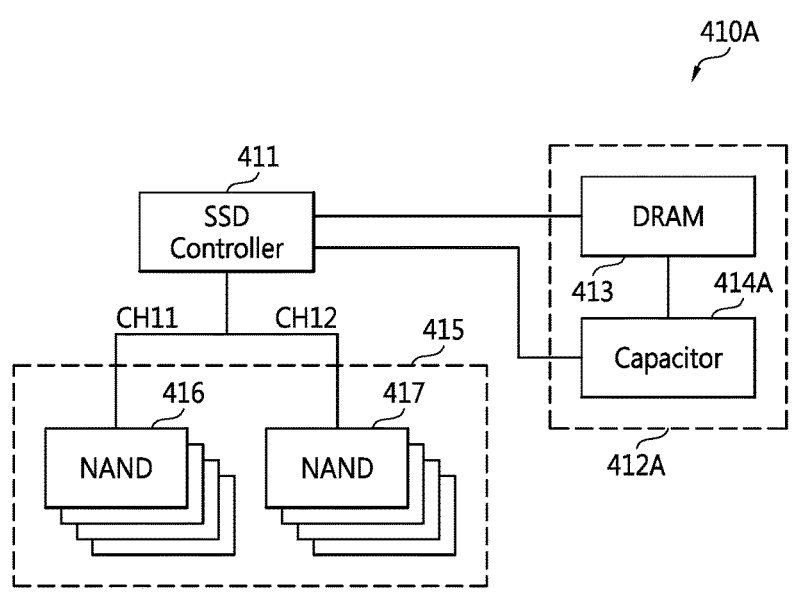
FIGS. 4A, 4B and 4C are block diagrams of examples of a first solid state drive or solid state disk (SSD) illustrated in FIG. 3.
Figure 4B:
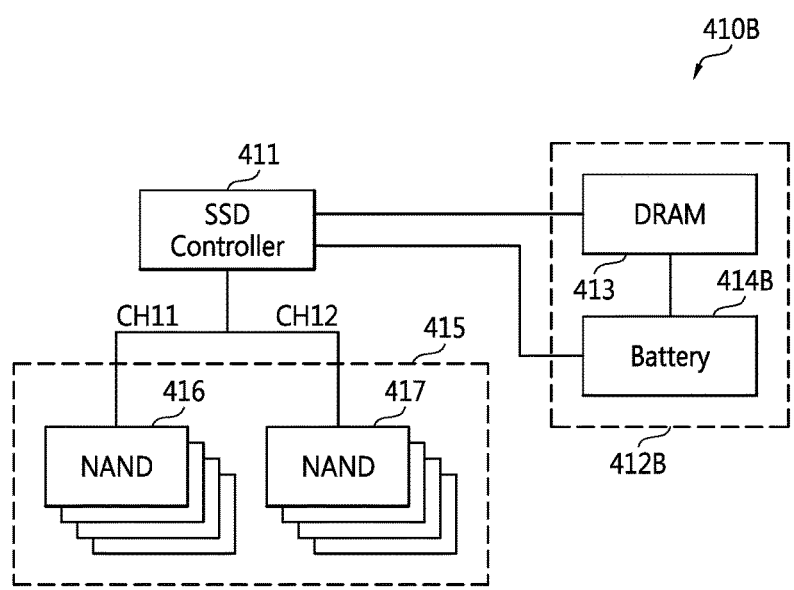
Figure 4C:
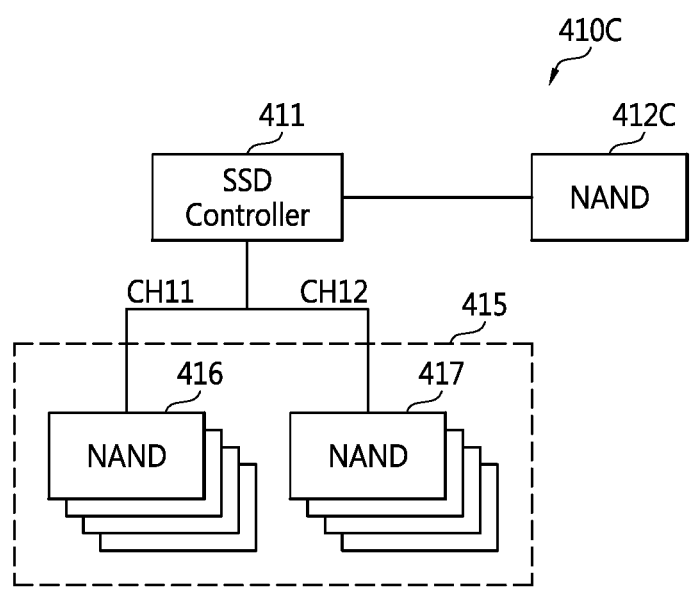

FIG. 3 is a block diagram of an example embodiment of data storage device 300 illustrated in FIG. 1. FIGS. 4A through 4C are block diagrams of examples 410A, 410B, and 410C of first SSD 410 illustrated in FIG. 3. Referring to FIGS. 3 through 4C, each of SSDs 410, 420, and 450 includes at least one first-type memory 412, 422, or 452 and at least one second-type memory 415, 425, or 455. First-type memory 412, 422, and 452 may be non-volatile RAM (NVRAM) and second-type memory 415, 425, and 455 may be non-volatile memory. Beneficially, second-type memory 415, 425, and 455 may be a different type of memory other than an NVRAM. For example, second-type memory 415, 425, and 455 may be NAND-type flash memory (NAND). However, the inventive concept is not restricted thereto.

First-type memory 412, 422, or 452 may be implemented as PRAM, MRAM, STT-MRAM, FRAM, or RRAM. The structure and operation of each of SSDs 410, 420, and 450 are substantially the same as or similar to those of the others. Thus, the structure and operation of first SSD 410 will be representatively described.

Referring to FIG. 4A, first SSD 410A may include an SSD controller 411, at least one NVRAM 412A, and at least one non-volatile memory device 415. Beneficially, non-volatile memory device 415 may be a different type of memory other than an NVRAM. For example, non-volatile memory device 415 may be a NAND-type flash memory device NAND. SSD controller 411 may control the operation of first SSD 410A in response to a command of controller 310. SSD controller 411 may be connected to the first main channel CHA, channels CH11 and CH12, and NVRAM 412A. Each of the channels CH11 and CH12 may be connected to non-volatile memory devices NAND. For instance, non-volatile memory devices 416 may be connected to the channel CH11 and non-volatile memory devices 417 may be connected to the channel CH12. Although only two channels CH11 and CH12 are illustrated in FIG. 4A, in other embodiments the number of channels may be different.

Each of the non-volatile memory devices NAND may be NAND-type flash memory or managed NAND flash memory, but is not restricted thereto. Each of the channels CH11 and CH12 may be an independent data path existing between SSD controller 411 and non-volatile memory devices 416 or 417.

NVRAM 412A may be implemented as capacitor-backed DRAM. NVRAM 412A may include a DRAM 413 and a capacitor 414A. Capacitor 414A may receive and store an externally-supplied input supply voltage and may provide the supply voltage for DRAM 413 when an external supply voltage is cut off. DRAM 413 may retain data even when the external supply voltage is cut off. SSD controller 411 may control the operation of the non-volatile memory devices NAND through each of the channels CH11 and CH12.

Referring to FIG. 4B, first SSD 410B may include SSD controller 411, at least one NVRAM 412B, and at least one non-volatile memory device 415, e.g., a NAND-type flash memory device NAND. The structure and operation of first SSD 410B illustrated in FIG. 4B are similar to those of first SSD 410A illustrated in FIG. 4A. To avoid redundancy, description will be focused on the differences between SSDs 410A and 410B.

NVRAM 412B may be implemented as battery-backed DRAM. NVRAM 412B may include DRAM 413 and a battery 414B. Battery 414B may supply power to DRAM 413 when an external supply voltage is cut off. Therefore, DRAM 413 may retain data even when the external supply voltage is cut off.

Referring to FIG. 4C, first SSD 410C may include SSD controller 411, at least one first-type memory 412C, and at least one second-type memory device 415, e.g., a NAND-type flash memory device NAND. The first-type memory 412C may have a faster access time (for example, write time) compared to the second-type memory 415. In case that the first-type memory 412C and the second-type memory device 415 are NAND-type flash memory, the first-type memory 412C may be a flash memory having single-level memory cells and the second-type memory device 415 may be a flash memory having multi-level memory cells The structure and operation of first SSD 410C illustrated in FIG. 4C are similar to those of first SSD 410A illustrated in FIG. 4A or first SSD 410B illustrated in FIG. 4B. To avoid redundancy, description will be focused on the differences among SSDs 410A, 410B, and 410C.

Referring to FIG. 4C, first-type memory 412C may be implemented as a NAND-type flash memory device NAND. The NAND-type flash memory device NAND may include a two-dimensional memory cell array or a three-dimensional memory cell array.

The three-dimensional memory cell array may be monolithically formed at one or more physical levels in an array of memory cells having an active region disposed on or above a silicon substrate and may include a circuit involved in the operation of the memory cells. The circuit may be formed in, on or above the silicon substrate. The term "monolithic" means that layers at each level in an array are directly deposited on layers at an underlying level in the array. The three-dimensional memory cell array may include a vertical NAND string which is vertically oriented so that at least one memory cell is placed on or above another memory cell. The at least one memory cell may include a charge trap layer.

Figure 5A:
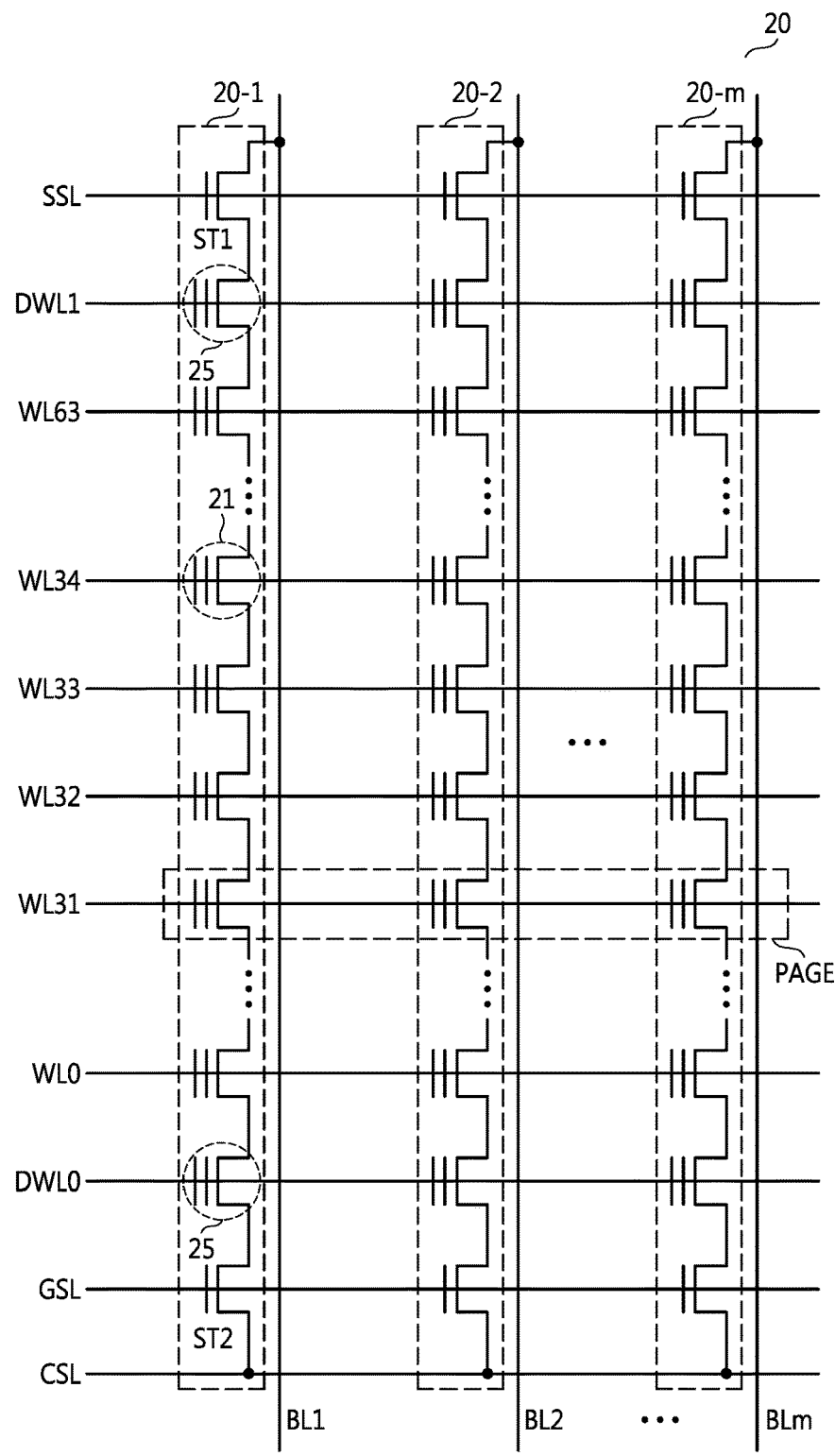
FIG. 5A is a diagram of a two-dimensional memory cell array of a NAND-type flash memory device according to some embodiments of the inventive concept.

FIG. 5A is a diagram of a two-dimensional memory cell array 20 of a NAND-type flash memory device according to some embodiments of the inventive concept. Referring to FIG. 5A, memory cell array 20 includes a plurality of NAND memory cell strings 20-1, 20-2, . . . , 20-$m$, where "m" is a natural number. Each of NAND memory cell strings 20-1 through 20-$m$ includes a plurality of nonvolatile memory cells 21 and dummy cells 25 connected in series with each other. NAND memory cell strings 20-1 through 20-$m$ may be laid out or embodied on one plane or layer in two dimensions.

NAND memory cell string 20-1 includes a plurality of non-volatile memory cells 21 and dummy cells 25 connected in series between a first selection transistor (or a string selection transistor) ST1 connected to the bit line BL1 and a second selection transistor (or a ground selection transistor) ST2 connected to a common source line (CSL).

A gate of the first selection transistor ST1 is connected to a string selection line (SSL). Gates of respective non-volatile memory cells 21 are connected to a plurality of word lines WL0 through W63, respectively. A gate of the second selection transistor ST2 is connected to a ground selection line (GSL). Gates of respective dummy cells 25 are connected to dummy word lines DWL0 and DWL1, respectively.

The structure of NAND memory cell strings 20-2 through 20-$m$ is substantially the same as that of NAND memory cell string 20-1.

Figure 5B:
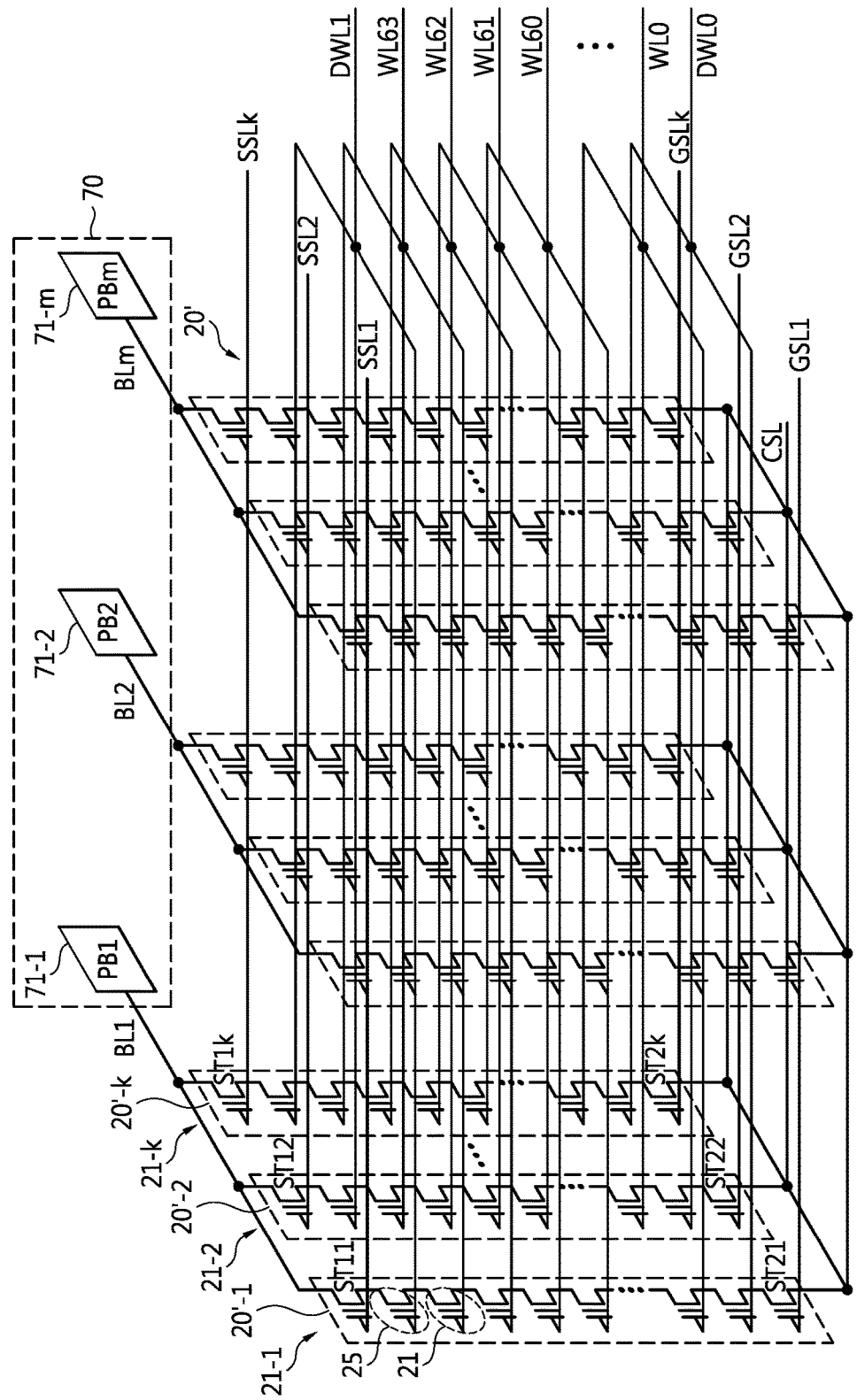
FIG. 5B is a diagram of a three-dimensional memory cell array of a NAND-type flash memory device according to some embodiments of the inventive concept.

Although 64 word lines WL0 through WL63 and two dummy word lines DWL0 and DWL1 are illustrated in FIGS. 5A and 5B for clarity of the description, the ideas of the inventive concept is not restricted by the numbers of word lines and dummy word lines. The dummy word lines DWL0 and DWL1 are respectively placed at both ends of a group of 64 word lines WL0 through WL63, that is, the dummy word lines DWL0 and DWL1 are adjacent to the SSL and the GSL, respectively, but the positions of dummy word lines are not restricted to the illustrated embodiment. The dummy word lines DWL0 and DWL1 may be omitted in other embodiments.

Each of non-volatile memory cells 21 included in NAND memory cell strings 20-1 through 20-$m$ may store one or more bits. Accordingly, each of non-volatile memory cells 21 may be embodied by a NAND flash memory cell storing one bit or at least one bit, e.g., a single level cell (SLC) or a multi-level cell (MLC).

FIG. 5B is a diagram of a three-dimensional memory cell array 20' of a NAND-type flash memory device according to some embodiments of the inventive concept. Referring to FIG. 5B, NAND memory cell strings 20'-1, 20'-2, . . . , 20'-k (where "k" is a natural number) may be laid out on different planes in three dimensions. At this time, an access circuit which can access each of NAND memory cell strings 20'-1 through 20'-k may be shared by NAND memory cell strings 20'-1 through 20'-k.

First NAND memory cell string 20'-1 may be laid out on a first layer 21-1, second NAND memory cell string 20'-2 may be laid out on a second layer 21-2 different from first layer 21-1, and the k-th NAND memory cell string 20'-k may be laid out on a k-th layer 21-k different from second layer 21-2. Layers 21-1 through 21-k may be formed in a wafer stack, a chip stack, or a cell stack. Layers 21-1 through 21-k may be connected with one another using a through-silicon via (TSV), a bump, or wire bonding. Each of layers 21-1 through 21-k includes a plurality of cell strings.

First NAND memory cell string 20'-1 on first layer 21-1 includes a plurality of non-volatile memory cells (e.g., NAND flash memory cells) 21 and dummy cells 25, connected in series between a plurality of selection transistors ST11 and ST21. Second NAND memory cell string 20'-2 on second layer 21-2 includes a plurality of non-volatile memory cells (e.g., NAND flash memory cells) 21 and dummy cells 25, connected in series between a plurality of selection transistors ST12 and ST22. K-th NAND memory cell string 20'-k on k-th layer 21-k includes a plurality of non-volatile memory cells (e.g., NAND flash memory cells) 21 and dummy cells 25, connected in series between a plurality of selection transistors ST1k and ST2k.

As illustrated in FIG. 5B, NAND memory cell strings 20'-1 through 20'-k may share the word lines WL0 through WL63, the CSL, and the bit line BL1 with one another. In other words, the NAND memory cell strings implemented at corresponding positions in respective layers 21-1 through 21-k may be connected to one of page buffers 71-1 through 71-m included in a page buffer and sense amplifier block 70.

Figure 6:
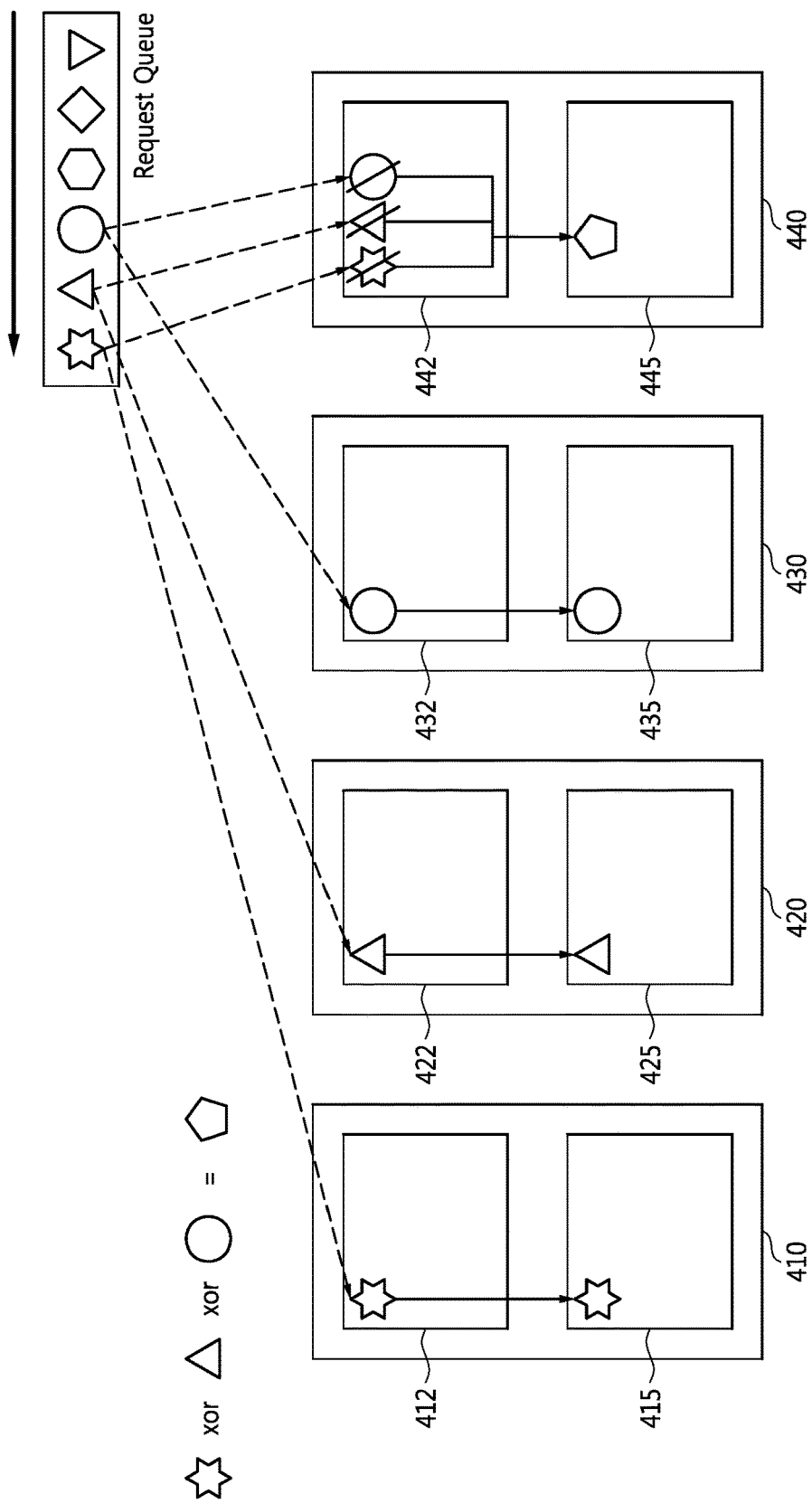
FIG. 6 is a diagram for explaining the operation of a data storage device according to some embodiments of the inventive concept.

FIG. 6 is a diagram for explaining the operation of a data storage device according to some embodiments of the inventive concept. The operation illustrated in FIG. 6 may be performed by data storage device 300 described with reference to FIGS. 1 through 4C. Here, it is assumed that N, the number of SSDs, is 4.

Referring to FIGS. 1 through 6, the controller 310 may receive a plurality of write requests from host 200. The write requests may be stored in a write request queue. The write request queue may be implemented in first-type memory (e.g., NVRAM) 412, 422, or 452, or in a separate module. Each of various shapes, i.e., a star, a triangle, a circle, a hexagon, and so on in the write request queue shown in FIGS. 6 through 8 denotes a data segment corresponding to one of the write requests.

Controller 310 stores a first data segment, which is denoted by the star and corresponds to a first write request, in first SSD 410. First SSD 410 may store the first data segment, i.e., the star in first-type memory (e.g., NVRAM) 412 in first SSD 410. Controller 310 may also store duplicated data of the first data segment, i.e., the star, in the N-th SSD for the duplication of the first data segment. The duplicated data may be data stored in order to recover a lost data in the event that a SSD among the plurality of SSDs fails or when data stored by one or more of the SSD is lost. Since it is assumed that N is 4, controller 310 may store the first data segment, i.e., the star in fourth SSD 440. The duplicated data of the first data segment, i.e., the star, may be the same as the first data segment, but the inventive concept is not restricted thereto. For example, the duplicated data of the first data segment may be data generated based on a logic operation of the first data segment to recover the first data segment.

As described above, controller 310 stores the first data segment, i.e., the star in first-type memory 412 of first SSD 410 and first-type memory 442 of fourth SSD 440, thereby performing primary duplication of the first data segment, i.e., the star. An operation of storing the first data segment, i.e., the star, in first-type memory 412 of first SSD 410 and an operation of storing the first data segment, i.e., the star, in first-type memory 442 of fourth SSD 440 may be performed in parallel or sequentially.

A command used by controller 310 to store the first data segment, i.e., the star, in first SSD 410 may be the same as or different from a command used by controller 310 to store the first data segment, i.e., the star, in fourth SSD 440. For instance, when controller 310 stores the first data segment, i.e., the star, in first SSD 410, whether the first data segment, i.e., the star, will be flushed to second-type memory 415 may not be designated. On the other hand, when controller 310 stores the duplicated data of the first data segment, i.e., the star in fourth SSD 440, controller 310 may designate that the first data segment, i.e., the star, will not be flushed to second-type memory.

FIG. 9A shows a new command that controller 310 issues to an SSD. The command "WriteNV(LBA, DATA, Flush_manually)" is issued by controller 310 to SSDs 410, 420, 430, and 440. Factors in the parentheses are command-line arguments. The command "WriteNV(LBA, DATA, Flush_manually)" may instruct that the data should be written to a designated logical block address (LBA) of the first-type memory of the SSD. At this time, whether to flush the data from the first-type memory to the second-type memory may be set using the argument "Flush_manually". When the value of "Flush_manually" is "0", it means that controller 310 does not designate whether to flush the data. Accordingly, an SSD may determine by itself whether and when to flush the data from the first-type memory to the second-type memory without intervention of controller 310. When the value of "Flush_manually" is "1", it means that controller 310 instructs that the data should not be flushed from the first-type memory to the second-type memory. Accordingly, the SSD does not flush the data from the first-type memory to the second-type memory without a flush command from controller 310.

The command "DeleteNV(LBA)" issued by controller 310 may instruct that the SSD should delete data from the designated address LBA of the first-type memory.

Controller 310 may set the value of "Flush_manually" to "0" when storing the first data segment, i.e., the star in first SSD 410 and may set the value of "Flush_manually" to "1" when storing the first data segment, i.e., the star, in fourth SSD 440. In this case, first SSD 410 may flush the first data segment, i.e., the star from first-type memory 412 to second-type memory 415 at a random point. Once the first data segment, i.e., the star, is stored in second-type memory 415, the first data segment, i.e., the star may be deleted from first-type memory 412. Meanwhile, fourth SSD 440 may not flush the first data segment, i.e., the star from first-type memory 442 to the second-type memory 445 unless it receives a separate command or request from controller 310.

Controller 310 may process a second data segment, which is denoted by the triangle and corresponds to a second write request, in the similar manner to the first data segment, i.e., the star. Controller 310 stores the second data segment, i.e., the triangle, in first-type memory 422 of second SSD 420. In addition, controller 310 stores the second data segment, i.e., the triangle, in first-type memory 442 of fourth SSD 440. In other words, controller 310 performs primary duplication of the second data segment, i.e., the triangle, by storing the second data segment, i.e., the triangle, in first-type memory 422 of second SSD 420 and first-type memory 442 of fourth SSD 440. An operation of storing the second data segment, i.e., the triangle, in first-type memory 422 of second SSD 420 and an operation of storing the second data segment, i.e., the triangle, in first-type memory 442 of fourth SSD 440 may be performed in parallel or sequentially.

Controller 310 may process a third data segment, which is denoted by the circle and corresponds to a third write request, in the similar manner to the first data segment, i.e., the star and the second data segment, i.e., the triangle. Controller 310 stores the third data segment, i.e., the circle, in first-type memory 432 of third SSD 430. In addition, controller 310 stores the third data segment, i.e., the circle in first-type memory 442 of fourth SSD 440. In other words, controller 310 performs primary duplication of the third data segment, i.e., the circle, by storing the third data segment, i.e., the circle in first-type memory 432 of third SSD 430 and first-type memory 442 of fourth SSD 440. An operation of storing the third data segment, i.e., the circle, in first-type memory 432 of third SSD 430 and an operation of storing the third data segment, i.e., the circle, in first-type memory 442 of fourth SSD 440 may be performed in parallel or sequentially.

The primary duplication may be RAID 1 duplication but is not restricted thereto. When data stored in a plurality of SSDs form a predetermined data group, controller 310 may issue a parity generation and store command to a parity SSD (e.g., fourth SSD 440), i.e., an SSD in which duplicated data has been stored. The predetermined data group may be a RAID stripe. The predetermined data group (e.g., RAID stripe) may be defined as a base unit on which a RAID recovery operation is performed. The RAID stripe may include a plurality of data segments (e.g., pages) used to generate parity. For instance, when data stored in first through N-th SSDs complete a single RAID stripe, controller 310 may issue the parity generation and store command to a parity SSD, i.e., an SSD in which duplicated data has been stored.

FIG. 9B shows examples of the parity generation and store command issued by controller 310 to fourth SSD 440. The inventive concept is not restricted to these examples.

The command "Calculate_Parity_And_Write1(DataSize, StartLBA, EndLBA, DestinationLBA)" issued by controller 310 may instruct fourth SSD 440 to generate a parity for data having the predetermined data size DataSize in a range from the start address StartLBA to the end address EndLBA in first-type memory 442 and to write the parity to the destination address DestinationLBA. In other words, the command "Calculate_Parity_And_Write1(DataSize, StartLBA, EndLBA, DestinationLBA)" designates the start and end addresses StartLBA and EndLBA of a data segment for which parity data will be calculated and also designates the address DestinationLBA of a region in which the parity data will be stored. When the data segment is stored at sequential logical block addresses (LBAs), this command may be used.

The command "Calculate_Parity_And_Write2(DataSize, FirstLBA, SecondLBA, LastLBA, DestinationLBA)" issued by the controller 310 may instruct fourth SSD 440 to generate a parity for data having the predetermined data size DataSize in a range from the first address FirstLBA to the last address LastLBA in first-type memory 442 and to write the parity to the destination address DestinationLBA. In other words, the command "Calculate_Parity_And_Write2 (DataSize, FirstLBA, SecondLBA, LastLBA, DestinationLBA)" designates the data size and the address LBA of each of data segments for which parity data will be calculated. When the data segments are stored at nonsequential LBAs, this command may be used.

The command "Calculate_Parity_And_Write3(DataSize, StartLBA, Offset, DestinationLBA)" issued by controller 310 may instruct fourth SSD 440 to generate a parity for data having the predetermined data size DataSize in a range from the start address StartLBA to the predetermined offset Offset in first-type memory 442 and to write the parity to the destination address DestinationLBA. In other words, the command "Calculate_Parity_And_Write3(DataSize, StartLBA, Offset, DestinationLBA)" designates the data size DataSize, the start address StartLBA, and the offset Offset to define a range of data to be used to calculate parity data.

Parity SSD 440 may generate parity data denoted by a pentagon based on the duplicated data, i.e., the first through third data segments, i.e., the star, the triangle, and the circle stored in first-type memory 442 and may store the parity data in second-type memory 445 in response to the parity generation and store command Parity SSD 440 may generate the parity data, i.e., the pentagon, by performing an XOR operation on the first through third data segments, i.e., the star, the triangle, and the circle, but the inventive concept is not restricted thereto. Once the parity data, i.e., the pentagon, is stored in second-type memory 445, parity SSD 440 may delete the duplicated data, i.e., the first through third data segments, i.e., the star, the triangle, and the circle, from first-type memory 442.

As described above, when the parity data, i.e., the pentagon, for the first through third data segments, i.e., the star, the triangle, and the circle is stored in second-type memory 445, the secondary duplication is performed. The secondary duplication may be RAID 5/6 duplication but is not restricted thereto.

Referring to FIG. 6, each of data segments forming a RAID stripe is primarily stored in first-type memory, i.e. NVRAM, of one of SSDs 410, 420, and 430. Each data segment, i.e., duplicated data of each data segment is primarily stored in first-type memory, i.e. NVRAM, of parity SSD 440. Data stored in first-type memory 442 of parity SSD 440 are subjected to an XOR operation to generate parity data when controller 310 issues the parity generation and store command and the parity data is stored in second-type memory 445.

Data stored in first-type memory NVRAM in each of first through third SSDs 410, 420, and 430 may be flushed to second-type memory at various times. The data may be flushed to the second-type memory right after, or a predetermined time after, it is stored in the first-type memory NVRAM, or when a certain event occurs after it is stored in the first-type memory NVRAM. The certain event may be a power failure of a current SSD, a buffer exceeding a predetermined threshold, or garbage collection, but is not restricted thereto.

In the embodiments illustrated in FIG. 6, duplicated data of all data segments, i.e., the first through third data segments, i.e., the star, the triangle, and the circle are stored in first-type memory 442 of fourth SSD 440 before parity data is generated and then controller 310 issues the parity generation and store command to fourth SSD 440.

Figure 7:
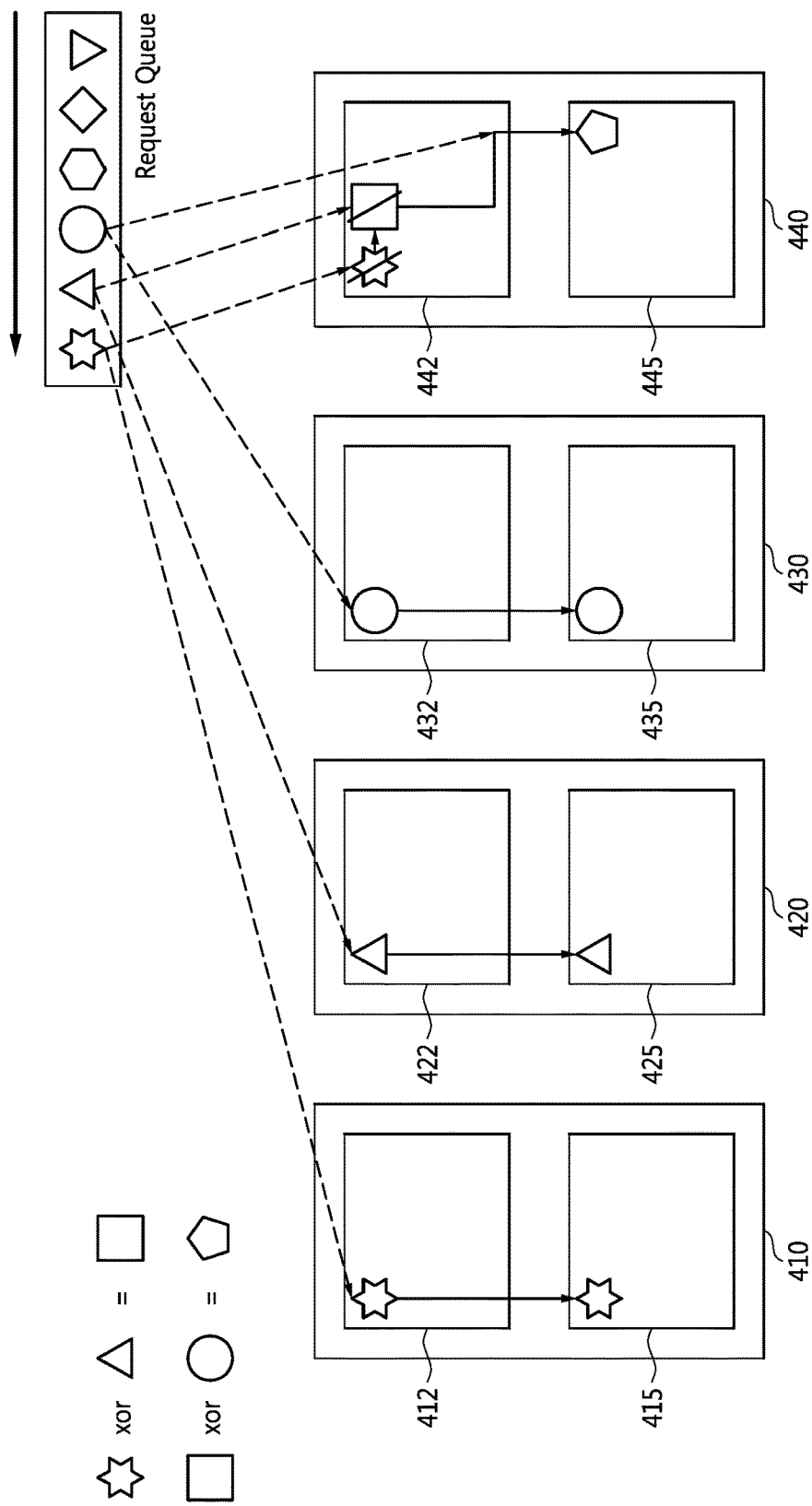
FIG. 7 is a diagram for explaining the operation of a data storage device according to other embodiments of the inventive concept.

FIG. 7 is a diagram for explaining the operation of a data storage device according to some embodiments of the inventive concept. The operation illustrated in FIG. 7 may be performed by data storage device 300 described with reference to FIGS. 1 through 4C. It is assumed that N, the number of SSDs, is 4. The operation illustrated in FIG. 7 is similar to the operation illustrated in FIG. 6. Thus, description will be focused on the differences.

Referring to FIG. 7, controller 310 does not store duplicated data of the first through third data segments, i.e., the star, the triangle, and the circle, in first-type memory 442 of fourth SSD 440, but stores only latest parity data in first-type memory 442. In detail, controller 310 stores the first data segment, i.e., the star, in first-type memory 442 of fourth SSD 440 but stores only parity data in first-type memory 442 of fourth SSD 440 for the next data segments, i.e., the triangle and the circle, instead of storing the duplicated data, i.e., the triangle and the circle, in first-type memory 442 of fourth SSD 440.

For this operation, controller 310 may send the parity generation and store command to fourth SSD 440 together with the second data segment, i.e., the triangle. In other words, controller 310 may designate a region necessary for the generation of parity data when transmitting the second data segment, i.e., the triangle, to fourth SSD 440. Fourth SSD 440 may generate partial parity data, i.e., a square based on the second data segment, i.e., the triangle, received from controller 310 and the first data segment, i.e., the star, stored in first-type memory 442 and may store the partial parity data, i.e., the square, in first-type memory 442. Once the partial parity data, i.e., the square, is stored in first-type memory 442, parity SSD 440 may delete the duplicated data, i.e., the first data segment, i.e., the star, from first-type memory 442.

Controller 310 may also send the parity generation and store command to fourth SSD 440 together with the third data segment, i.e., the circle. In other words, controller 310 may designate a region necessary for the generation of parity data when transmitting the third data segment, i.e., the circle, to fourth SSD 440.

FIG. 9C shows examples of the parity generation and store command, which includes a data segment and is issued by controller 310 to fourth SSD 440. The inventive concept is not restricted to these examples.

The command "Write_and_Calc_Parity1(Data, DataSize, StartLBA, EndLBA, DestinationLBA)" issued by controller 310 may instruct fourth SSD 440 to generate a parity for new data Data and data having the predetermined data size DataSize in a range from the start address StartLBA to the end address EndLBA in first-type memory 442 and to write the parity to the destination address DestinationLBA. This command may be used when all duplicated data for which parity data will be generated have not stored in parity SSD 440. In other words, when only some of duplicated data for which parity data will be generated have been stored in parity SSD 440, the command is issued to send new or additional data for the generation of parity data and to designate the data that have been stored in parity SSD 440.

The command "Write_and_Calc_Parity2(Data, DataSize, FirstLBA, SecondLBA, LastLBA, DestinationLBA)" is similar to the command "Calculate_Parity_And_Write2(DataSize, FirstLBA, SecondLBA, LastLBA, DestinationLBA)" but is different in the respect that it also includes new data Data. The command "Write_and_Calc_Parity3(Data, DataSize, StartLBA, Offset, DestinationLBA)" is similar to the command "Calculate_Parity_And_Write3(DataSize, StartLBA, Offset, DestinationLBA)" but is different in the respect that it also includes new data Data.

When controller 310 designates a region necessary for the generation of parity data and transmits the third data segment, i.e., the circle, to fourth SSD 440, fourth SSD 440 may generate the parity data, i.e., the pentagon based on the third data segment, i.e., the circle, received from controller 310 and the partial parity data, i.e., the square stored in first-type memory 442 and may store the parity data, i.e., the pentagon, in second-type memory 445. Once the parity data, i.e., the pentagon is stored in second-type memory 445, parity SSD 440 may delete the partial parity data, i.e., the square from first-type memory 442.

In the embodiments illustrated in FIG. 7, parity SSD 440 does not double-store a data segment but stores only the latest parity data, thereby saving the space of first-type memory 442.

Figure 8:
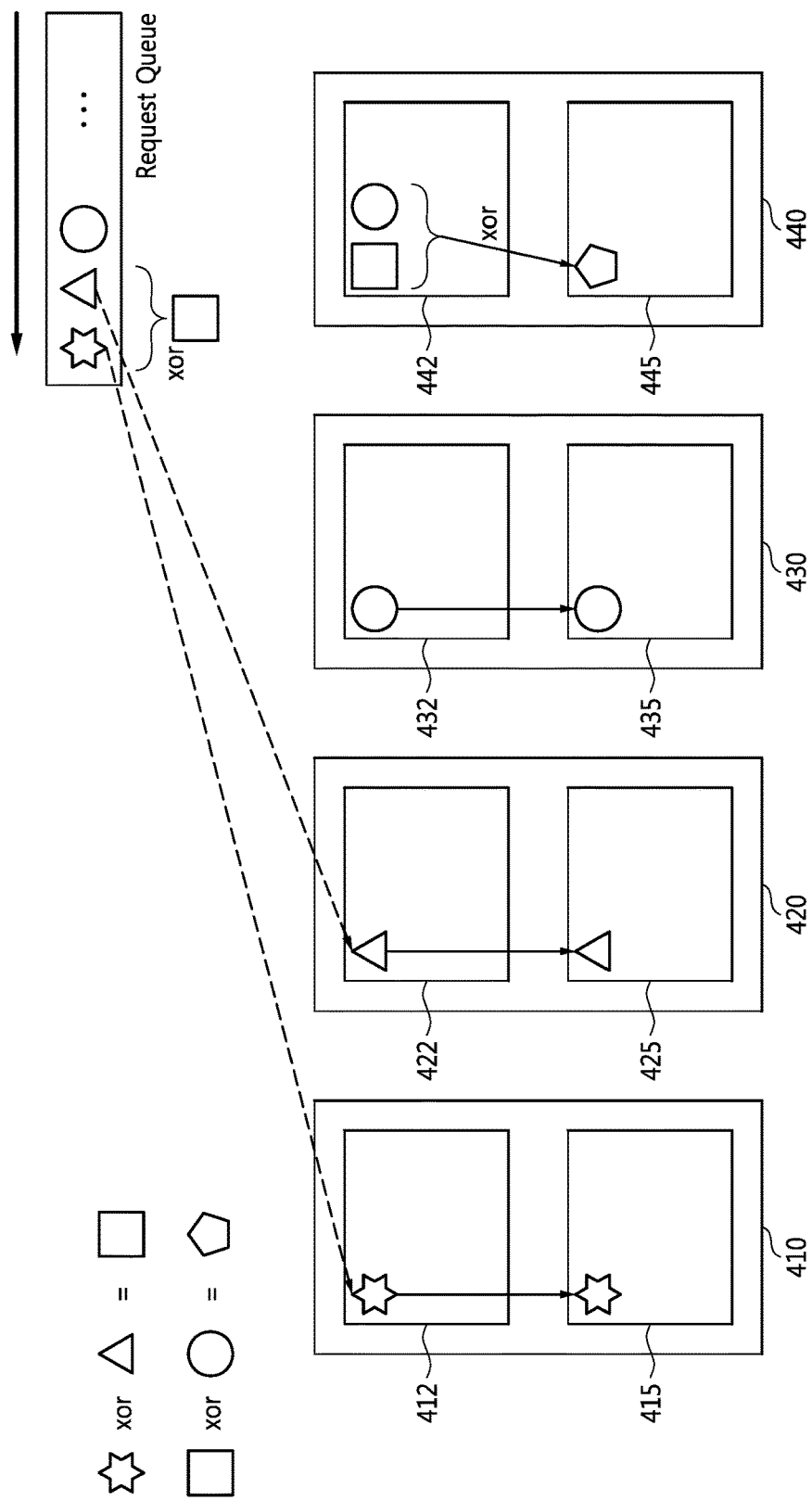
FIG. 8 a diagram for explaining the operation of a data storage device according to further embodiments of the inventive concept.

FIG. 8 a diagram for explaining the operation of a data storage device according to further embodiments of the inventive concept. The operation illustrated in FIG. 8 may be performed by data storage device 300 described with reference to FIGS. 1 through 4C. It is assumed that N, the number of SSDs, is 4. The operation illustrated in FIG. 8 is similar to the operation illustrated in FIG. 7. Thus, description will be focused on the differences. Referring to FIG. 8, when many write requests are accumulated at the write request queue, controller 310 generates parity data from data to be duplicated and stores the parity data in parity SSD 440.

In the embodiments illustrated in FIG. 7, after storing duplicated data of the first data segment, i.e., the star in first-type memory 442 of fourth SSD 440, controller 310 generates and stores only latest parity data in first-type memory 442. However, in the embodiments illustrated in FIG. 8, controller 310 generates the partial parity data, i.e., the square, for the first and second data segments, i.e., the star and the triangle, and stores the partial parity data, i.e., the square in first-type memory 442 of fourth SSD 440. Thereafter, as for the next data segment, i.e., the circle, controller 310 may send the parity generation and store command including the third data segment, i.e., the circle, to fourth SSD 440. In other words, controller 310 may designate a region necessary for the generation of parity data when transmitting the third data segment, i.e., the circle, to fourth SSD 440.

FIG. 9D shows examples of the parity generation and store command, which includes a data segment and is issued by controller 310 to fourth SSD 440. The inventive concept is not restricted to these examples.

The command "Calculate_Parity_And_Write_NV(PrevLBA, Data, DataSize, DataLBA)" is another example of the command that controller 310 issues to parity SSD 440. The command "Calculate_Parity_And_Write_NV(PrevLBA, Data, DataSize, DataLBA)" may be used when controller 310 stores an update of the parity data in parity SSD 440 without duplicating data.

The command "Calculate_Parity_And_Write_NV(PrevLBA, Data, DataSize, DataLBA)" designates the existing LBA PrevLBA of a data segment or partial parity data that has been stored in first-type memory 442 of fourth SSD 440 and designates the new data Data, the data size DataSize, and the LBA value DataLBA of data to be stored. Fourth SSD 440 may generate parity data using the data segment or partial parity data stored in first-type memory 442 of fourth SSD 440 and the new data Data and may store the parity data at the LBA value DataLBA in response to the command "Calculate_Parity_And_Write_NV(PrevLBA, Data, DataSize, DataLBA)". In detail, fourth SSD 440 may read data from first-type memory 442 based on the existing LBA PrevLBA, calculate parity data using the new data Data and the read data corresponding to the data size DataSize, and store the parity data at the LBA value DataLBA. The LBA value DataLBA may be the same as the existing LBA PrevLBA.

According to the embodiments illustrated in FIG. 8, some of duplicated data do not need to be stored in first-type memory 442 of parity SSD 440, so that storage space overhead in the first-type memory NVRAM of parity SSD 440 can be reduced.

According to some embodiments of the inventive concept, data storage device 300 uses first-type memory, e.g., NVRAM in an SSD, as a storage space for storing duplicated data (e.g., data for primary duplication), so that separate NVRAM other than the SSD is not necessary to store the duplicated data. As a result, the storage density of a system may be increased. In addition, since a separate memory device (e.g., an NVRAM device) for data duplication is not necessary, a hardware resource such as a slot for installation of the memory device may be saved. As a result, power and cost may be reduced.

Figure 10:
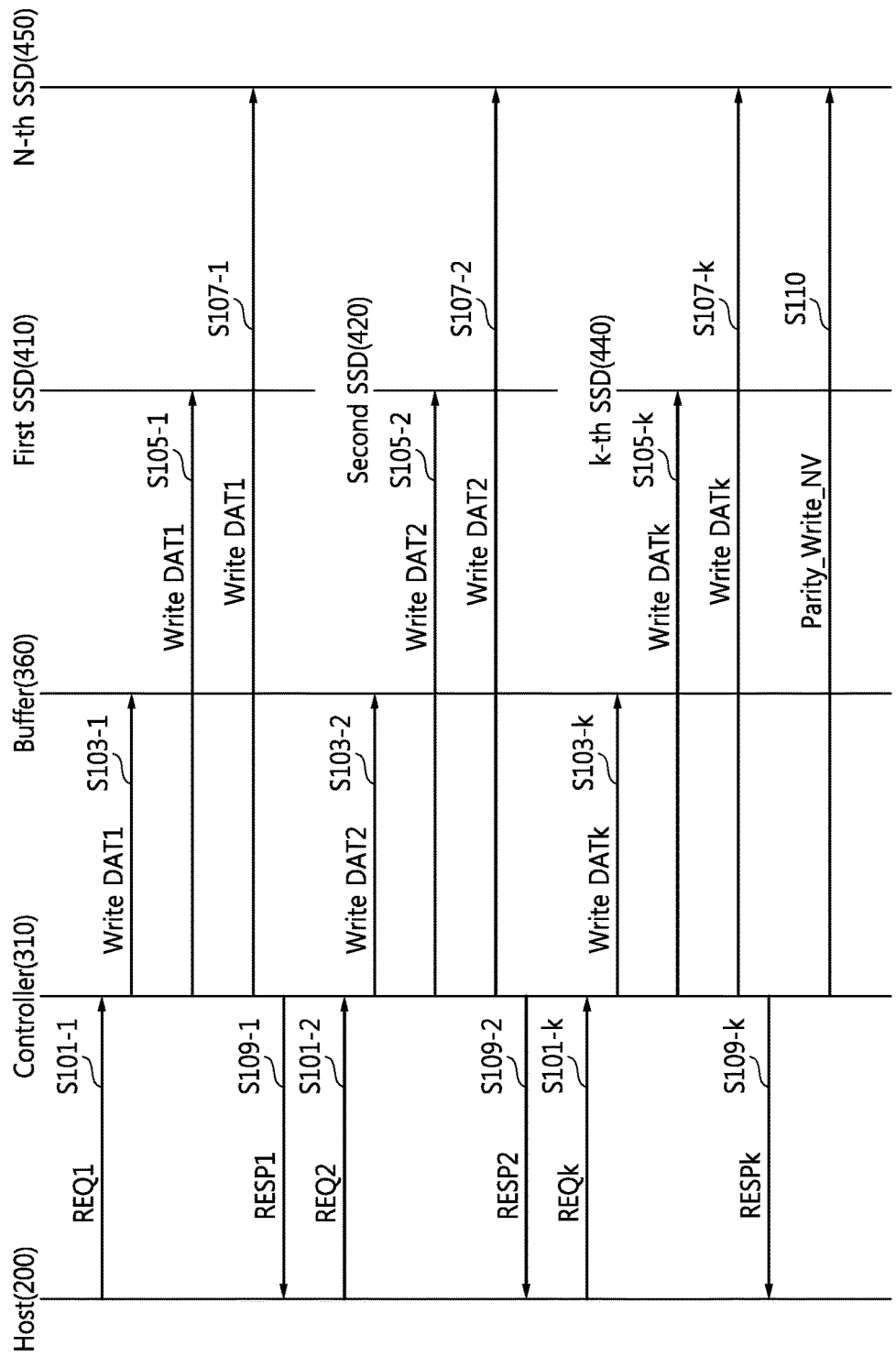
FIG. 10 is a flowchart of a method of duplicating data according to some embodiments of the inventive concept.

FIG. 10 is a flowchart of a method of duplicating data according to some embodiments of the inventive concept. The method illustrated in FIG. 10 may be performed by data storage device 300 described with reference to FIGS. 1 through 4C. Here, it is assumed that N, the number of SSDs, is 5.

Referring to FIGS. 1 through 4C and FIG. 10, controller 310 may receive a plurality of write requests REQ1 through REQk, where "k" is an integer of at least 2. The write requests REQ1 through REQk may be sequentially stored in a write request queue. Controller 310 receives the first write request REQ1 from host 200 in operation S101-1 and writes a first data segment DAT1 corresponding to the first write request REQ1 first to buffer 360 in operation S103-1.

Controller 310 also writes the first data segment DAT1 to first SSD 410 in response to the first write request REQ1 in operation S105-1. First SSD 410 may store the first data segment DAT1 in its first-type memory, e.g., NVRAM 412. Controller 310 may also store duplicated data of the first data segment DAT1 in N-th SSD 450 in operation S107-1. N-th SSD 450 may store the first data segment DAT1 in its first-type memory, e.g., NVRAM 452.

As described above, controller 310 may perform primary duplication of the first data segment DAT1 by writing the first data segment DAT1 to first-type memory 412 of first SSD 410 and first-type memory 452 of N-th SSD 450. Operations S105-1 and S107-1 may be performed in parallel or sequentially. A command used by controller 310 to request first SSD 410 to store the first data segment DAT1 may be the same as or different from a command used by controller 310 to request a parity SSD, i.e., N-th SSD 450 to store the first data segment DAT1. Controller 310 may send the command WriteNV illustrated in FIG. 9A to a relevant SSD to write the first data segment DAT1. Controller 310 sends a response RESP1 to the first write request REQ1 to host 200 in operation S109-1.

Controller 310 may process the second write request REQ2 received from host 200 in a similar manner to the first write request REQ1. In detail, controller 310 receives the second write request REQ2 from host 200 in operation S101-2 and writes a second data segment DAT2 corresponding to the second write request REQ2 first to buffer 360 in operation S103-2.

Controller 310 also writes the second data segment DAT2 to second SSD 420 in response to the second write request REQ2 in operation S105-2. Controller 310 may also write the second write request REQ2 to first-type memory 452 of N-th SSD 450 in operation S107-2. In other words, controller 310 performs primary duplication of the second data segment DAT2 by writing the second data segment DAT2 to first-type memory 422 of second SSD 420 and first-type memory 452 of N-th SSD 450. Operations S105-2 and S107-2 may be performed in parallel or sequentially. Controller 310 sends a response RESP2 to the second write request REQ2 to host 200 in operation S109-2.

Controller 310 may process other write requests, e.g., REQ3 through REQk in a similar manner to the first and second write requests REQ1 and REQ2 until data segments corresponding to a plurality of write requests received from host 200 form a predetermined data group. Although not shown, controller 310 may process the third write request REQ3 in a similar manner to the first and second write requests REQ1 and REQ2.

Controller 310 may also process the k-th write request REQk in a similar manner to the first and second write requests REQ1 and REQ2. In detail, controller 310 receives the k-th write request REQk from host 200 in operation S101-k and writes a k-th data segment DATk corresponding to the k-th write request REQk first to buffer 360 in operation S103-k.

Controller 310 also writes the k-th data segment DATk to first-type memory 442 of k-th SSD 440 in response to the k-th write request REQk in operation S105-k. Controller 310 may also write the k-th write request REQk to first-type memory 452 of N-th SSD 450 in operation S107-k. In other words, the controller 310 performs primary duplication of the k-th data segment DATk by writing the k-th data segment DATk to first-type memory 442 of k-th SSD 440 and first-type memory 452 of N-th SSD 450. Operations S105-k and S107-k may be performed in parallel or sequentially. Controller 310 sends a response RESPk to the k-th write request REQk to host 200 in operation S109-k. Here, "k" may be N−1 but is not restricted thereto. The primary duplication may be RAID 1 duplication.

When data stored in SSDs 410 through 440 form the predetermined data group, controller 310 may send a parity generation and store command Parity_Write_NV to SSD 450, i.e., parity SSD 450 where duplicated data is stored in operation S110. The parity generation and store command Parity_Write_NV that controller 310 issues to N-th SSD 450 may be one of the commands shown in FIG. 9B.

Parity SSD 450 may generate parity data based on duplicated data, i.e., the first through k-th data segments DAT1 through DATk stored in first-type memory 452 and store the parity data in first-type memory 452 or second-type memory 455 in response to the parity generation and store command Parity_Write_NV. Parity SSD 450 may generate the parity data by performing an XOR operation on the first through k-th data segments DAT1 through DATk, but the inventive concept is not restricted thereto. Once the parity data is stored in second-type memory 455, parity SSD 450 may delete the duplicated data, i.e., the first through k-th data segments DAT1 through DATk from first-type memory 452 of SSD 450.

Referring to FIG. 10, each of data segments forming a RAID stripe is primarily stored in first-type memory, e.g., NVRAM of one of SSDs 410 through 440. When each data segment, i.e., duplicated data of each data segment, is written to parity SSD 450, it is primarily stored in first-type memory 452. The data stored in first-type memory 452 of parity SSD 450 may be used to generate parity data when parity SSD 450 receives a parity generation and store command from controller 310, and then the parity data is finally stored in first-type memory 452 or second-type memory 455. When the parity data is stored in second-type memory 455, the duplicated data and/or parity data stored in first-type memory 452 may be deleted.

Figure 11:
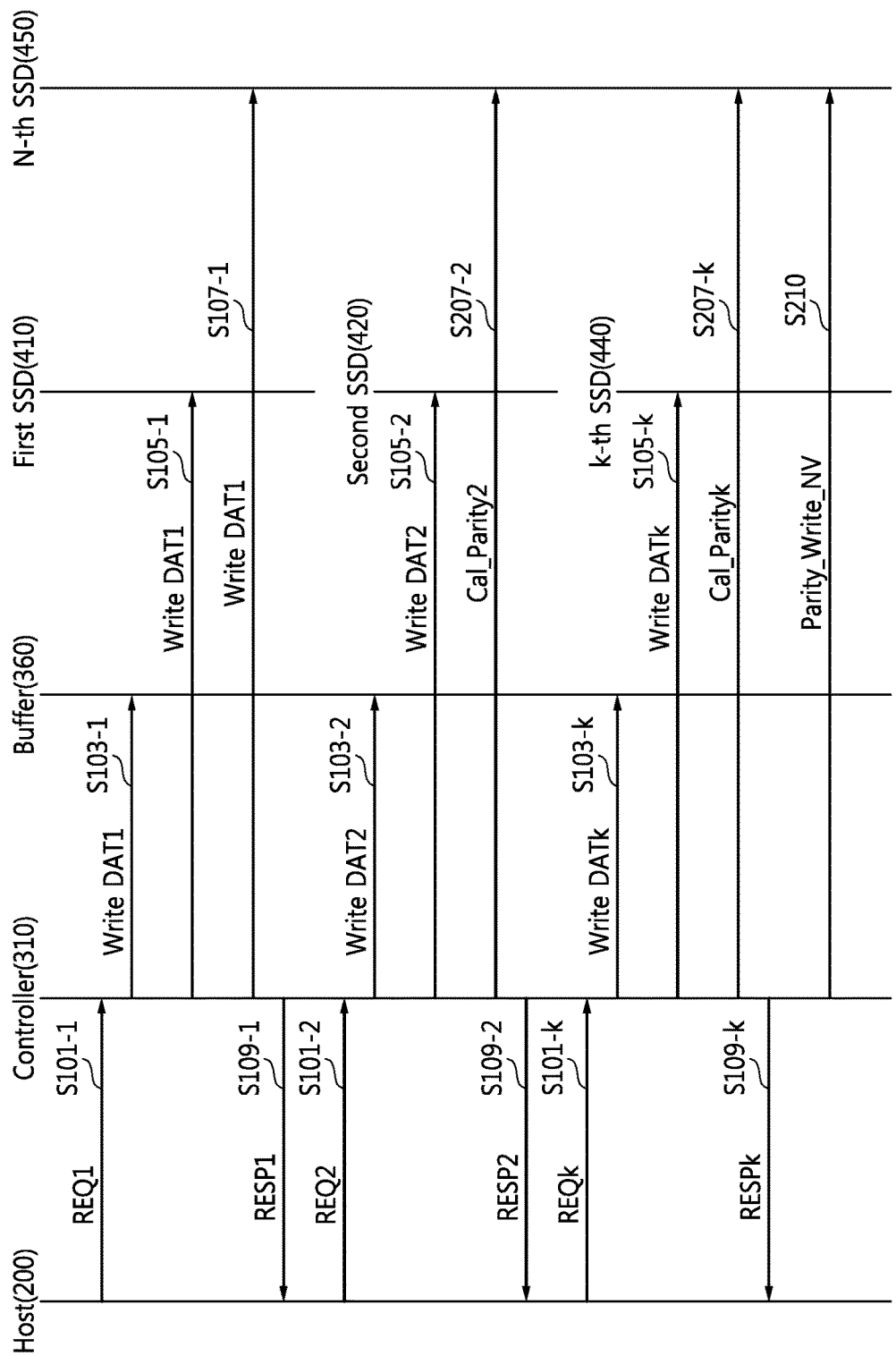
FIG. 11 is a flowchart of a method of duplicating data according to other embodiments of the inventive concept.

FIG. 11 is a flowchart of a method of duplicating data according to other embodiments of the inventive concept. The method illustrated in FIG. 11 may be performed by data storage device 300 described with reference to FIGS. 1 through 4C. Here, it is assumed that N, the number of SSDs, is 5. The method illustrated in FIG. 11 is similar to the method illustrated in FIG. 10. Thus, description will be focused on the differences between the methods. In the embodiments illustrated in FIG. 11, instead of storing duplicated data of each data segment in parity SSD 450, controller 310 stores duplicated data of only one data segment, e.g., the first data segment DAT1 in a predetermined data group (e.g., a RAID stripe) in parity SSD 450 and then stores an update of parity data in parity SSD 450 with respect to subsequent data segments starting from the second data segment DAT2.

Referring to FIGS. 1 through 4C and FIG. 11, controller 310 may receive a plurality of the write requests REQ1 through REQk, where "k" is an integer of at least 2. The write requests REQ1 through REQk may be sequentially stored in a write request queue. The controller 310 may process the first write request REQ1 in the same manner (i.e., operations S101-1, S103-1, S105-1, S107-1, and S109-1) as that described with reference to FIG. 10.

In response to the second write request REQ2, controller 310 writes the second data segment DAT2 first to buffer 360 in operation S103-2 and also writes the second data segment DAT2 to second SSD 420 in operation S105-2. Controller 310 may send the second data segment DAT2 and a parity generation and store command Cal_Parity2 to N-th SSD 450 in operation S207-2. In other words, controller 310 may designate a region necessary for the generation of parity data when transmitting the second data segment DAT2 to N-th SSD 450. For this operation, controller 310 may use one of the commands shown in FIG. 9C as the parity generation and store command Cal_Parity2.

N-th SSD 450 may generate parity data based on the second data segment DAT2 received from controller 310 and the first data segment DAT1 that has been stored in first-type memory 452 and may store the parity data in second-type memory 455. Although not shown, controller 310 may process the third write request REQ3 received from host 200 in a similar manner to the second write request REQ2.

Controller 310 may also process the k-th write request REQk in a similar manner to the second and third write requests REQ2 and REQ3. In detail, in response to the k-th write request REQk, controller 310 writes the k-th data segment DATk first to buffer 360 in operation S103-k and also writes the k-th data segment DATk to k-th SSD 440 in operation S105-k.

Controller 310 may send the k-th data segment DATk and a parity generation and store command Cal_Parityk to N-th SSD 450 in operation S207-k. In other words, controller 310 may designate a region necessary for the generation of parity data when transmitting the k-th data segment DATk to N-th SSD 450. N-th SSD 450 may generate parity data based on the k-th data segment DATk received from controller 310 and the data segments DAT1, DAT2, and DAT3 that have been stored in first-type memory 452 and may store the parity data at a designated address.

Controller 310 may send a command to N-th SSD 450 to permanently store final parity data that has been stored in first-type memory 452 in second-type memory 455 in operation S210. In the embodiments illustrated in FIG. 11, controller 310 sends the parity generation and store command Parity_Write_NV to parity SSD 450 and parity SSD 450 generates the parity data in response to the command Parity_Write_NV.

However, controller 310 may generate parity data and write the parity data to parity SSD 450 in other embodiments. For instance, controller 310 may generate parity data using at least two data segments and write the parity data to first-type memory 452 of parity SSD 450. Controller 310 may also generate new parity data or update the parity data using at least one new data segment and the existing parity data and may write the updated parity data to first-type memory 452 of parity SSD 450.

Figure 12:
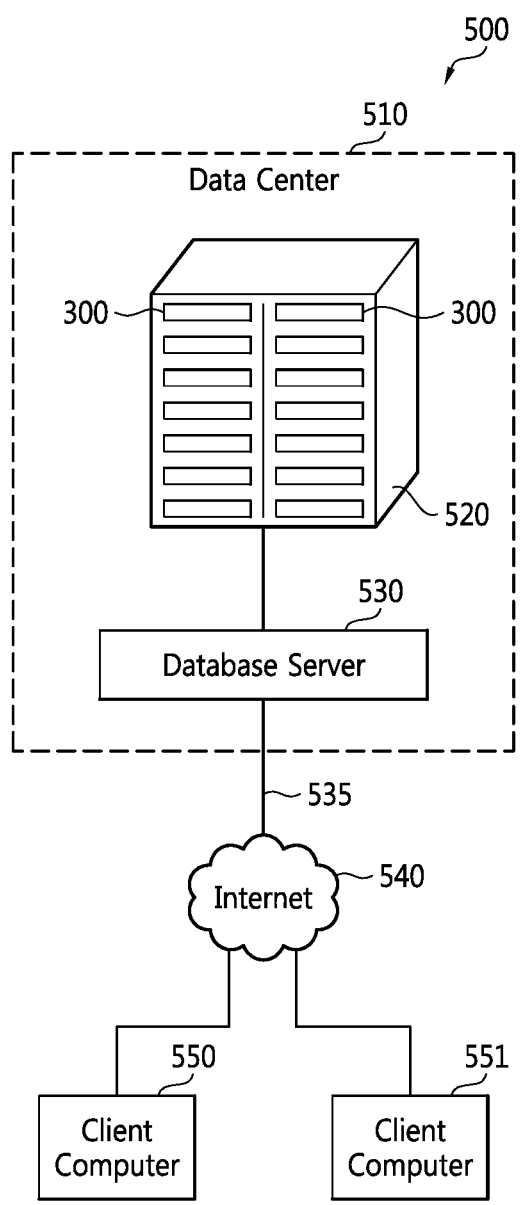
FIG. 12 is a block diagram of a data processing system according to some embodiments of the inventive concept.

FIG. 12 is a block diagram of a data processing system 500 according to some embodiments of the inventive concept. Referring to FIGS. 1 through 12, data processing system 500 may include a database 520, a database server 530, a second network 540, and a plurality of client computers 550 and 551. Database 520 and database server 530 may be included in a data center 510. Data center 510 may be an internet data center or a cloud data center.

Database 520 may include a plurality of data storage devices 300. Data storage devices 300 may be installed in racks. The structure and operations of data storage devices 300 are substantially the same as or similar to those of data storage device 300 described above with reference to FIGS. 1 through 11.

Database server 530 may control the operations of each of data storage devices 300. Database server 530 may function as host 200 illustrated in FIG. 1. Database server 530 may be connected to second network 540, e.g. an internet or Wi-Fi, via a first network 535, e.g., a local area network (LAN). Client computers 550 and 551 may be connected to database server 530 via second network 540.

As described above, according to some embodiments of the inventive concept, a data storage device uses first-type memory, e.g., NVRAM in an SSD as a storage space for storing duplicated data, i.e., data for primary duplication, so that separate NVRAM other than the SSD is not necessary to store the duplicated data. As a result, the storage density of a system may be increased. In addition, since another memory device, e.g., an NVRAM device for data duplication is not necessary, a hardware resource such as a slot into which the memory device is inserted may not be necessary. As a result, power and cost reduction may be achieved.

While the inventive concept has been particularly shown and described with reference to exemplary embodiments thereof, it will be understood by those of ordinary skill in the art that various changes in forms and details may be made therein without departing from the spirit and scope of the inventive concept as defined by the following claims.

What is claimed is:

1. A data processing system comprising:
a host; and
a data storage device connected to the host, the data storage device comprising:
first through N-th solid state disks (SSDs), where N is an integer of at least 2, wherein each of the first through N-th SSDs include a first-type memory and a second-type memory different from the first-type memory, wherein an access time for accessing the first-type memory is faster than an access time for accessing the second-type memory, and
a controller configured to control the first through N-th SSDs,
wherein the controller is configured to store each of data segments corresponding to a plurality of write requests received from the host in the first-type memory of a corresponding one of the first through (N−1)-th SSDs, to store duplicated data based on at least some of the data segments in the first-type memory of the N-th SSD, and to store parity data based on all of the data segments in either of the first-type memory and the second-type memory of the N-th SSD, wherein the controller is configured to write a first data segment to the first SSD and the same data as the first data segment to the N-th SSD in response to a first write request, and to write a second data segment to the second SSD and the same data as the second data segment to the N-th SSD in response to a second write request, and wherein the N-th SSD is configured to generate the parity data using first through (N−1)-th data segments stored in the first-type memory of the N-th SSD in response to a parity generation and store command received from the controller, to store the parity data in its second-type memory, and to delete the first through (N−1)-th data segments from its first-type memory.

2. The data processing system of claim 1, wherein the duplicated data is first partial parity data calculated using a first data segment and a second data segment.

3. The data processing system of claim 2, wherein the N-th SSD is configured to store the first data segment in its first-type memory, to generate the first partial parity data using the second data segment received from the controller and the first data segment stored in its first-type memory, to store the first partial parity data in its first-type memory, and then to delete the first data segment from its first-type memory.

4. The data processing system of claim 1, wherein the N-th SSD is configured to receive from the controller the duplicated data generated based on a first data segment and a second data segment, and to store the duplicated data in its first-type memory.

5. The data processing system of claim 1, wherein the first-type memory of each of the SSDs is non-volatile random access memory (NVRAM) and second-type memory of each of the SSDs is NAND flash memory.

6. A method of operating a data storage device which includes a controller, a buffer, and a plurality of solid state disks (SSDs), the method comprising:
receiving a first write request from a host;
writing a first data segment to the buffer in response to the first write request;
writing the first data segment to a first SSD among the plurality of SSDs;
writing the first data segment to an N-th SSD among the plurality of SSDs;
sending a response to the first write request to the host;
receiving a second write request from the host;
writing a second data segment to the buffer in response to the second write request;
writing the second data segment to a second SSD among the plurality of SSDs;
writing duplicated data based on the second data segment to the N-th SSD;
sending a response to the second write request to the host; and
storing parity data based on first through (N−1)-th data segments in the N-th SSD,
wherein storing the parity data in the N-th SSD comprises:
generating the parity data using the first data segment and the second data segment which are stored in first-type memory of the N-th SSD,
storing the parity data in second-type memory of the N-th SSD, and
deleting the first data segment and the second data segment from the first-type memory of the N-th SSD.

7. The method of claim 6, wherein the duplicated data based on the second data segment is the same as the second data segment.

8. The method of claim 6, wherein the duplicated data based on the second data segment is first partial parity data calculated using the first data segment and the second data segment.

9. The method of claim 8, wherein the writing the duplicated data based on the second data segment to the N-th SSD comprises:
receiving the second data segment from the controller;
generating the duplicated data based on the second data segment using the second data segment and the first data segment stored in first-type memory of the N-th SSD;
storing the duplicated data based on the second data segment in the first-type memory of the N-th SSD; and
deleting the first data segment from the first-type memory of the N-th SSD.

10. A data storage device, comprising:
a plurality of solid state drives (SSDs), including at least a first SSD, a second SSD and a parity SSD, wherein each of the SSDs includes at least one first-type memory and at least one second-type memory different from the first-type memory, wherein an access time for accessing the first-type memory is faster than an access time for accessing the second-type memory; and
a controller configured to control operations of the plurality of SSDs,
wherein the controller is configured to write a first data segment to the first-type memory of the first SSD in response to a first write command received from a host, and to write a second data segment to the first-type memory of the second SSD in response to a second write command received from the host, and further in response to the at least one of the first and second write commands received from the host to write data based on the first data segment and the second data segment to the first-type memory of the parity SSD, and subsequently to write parity data generated from at least the first data segment and the second data segment to at least one of the first-type memory and the second-type memory of the parity SSD,
wherein the data based on the first data segment and the second data segment comprises the first data segment and partial parity data for the first data segment and second data segment, and wherein the controller is configured to write the first data segment to the first-type memory of the parity SSD in response to the first write command and to write the partial parity data for the first data segment and second data segment to the first-type memory of the parity SSD in response to the second write command.

11. The data storage device of claim 10, wherein the first-type memory is a non-volatile random access memory (NVRAM).

12. The data storage device of claim 11, wherein the second-type memory is a NAND flash memory.

13. The data storage device of claim 10, wherein the data based on the first data segment and the second data segment comprises the first data segment and the second data segment, and wherein the controller is configured to write the first data segment to the first-type memory of the parity SSD in response to the first write command and to write the second data segment to the first-type memory of the parity SSD in response to the second write command.

14. The data storage device of claim 10, wherein the data based on the first data segment and the second data segment comprises the first data segment and partial parity data for the first data segment and second data segment, and wherein the controller is configured to write the partial parity data for the first data segment and second data segment to the first-type memory of the parity SSD in response to the second write command.

15. The data storage device of claim 10, wherein the first data segment and the second data segment belong to a predetermined data group comprising k data segments, where k>2, and wherein the parity data generated from the first data segment and the second data segment comprises parity data generated from all k data segments, and wherein the controller writes the parity data to the at least one of the first-type memory and the second-type memory of the parity SSD after receiving a k-th write command from the host for writing the k-th data segment to the first-type memory of a k-th one of the SSDs.

* * * * *